(12) United States Patent
Nishi et al.

(10) Patent No.: US 8,916,960 B2
(45) Date of Patent: Dec. 23, 2014

(54) SEMICONDUCTOR UNIT

(71) Applicant: Kabushiki Kaisha Toyota Jidoshokki, Kariya-shi, Aichi-ken (JP)

(72) Inventors: Shinsuke Nishi, Aichi-ken (JP); Shogo Mori, Aichi-ken (JP); Yuri Otobe, Aichi-ken (JP); Naoki Kato, Aichi-ken (JP)

(73) Assignee: Kabushiki Kaisha Toyota Jidoshokki, Aichi (JP)

( * ) Notice: Subject to any disclaimer, the term of this patent is extended or adjusted under 35 U.S.C. 154(b) by 0 days.

(21) Appl. No.: 13/934,944

(22) Filed: Jul. 3, 2013

(65) Prior Publication Data

US 2014/0008782 A1    Jan. 9, 2014

(30) Foreign Application Priority Data

Jul. 6, 2012    (JP) .................. 2012-152578

(51) Int. Cl.
*H01L 23/48* (2006.01)
*H01L 23/52* (2006.01)
*H01L 23/34* (2006.01)
*H01L 23/373* (2006.01)
*H01L 23/473* (2006.01)
*H01L 23/00* (2006.01)

(52) U.S. Cl.
CPC ............ *H01L 23/34* (2013.01); *H01L 23/3735* (2013.01); *H01L 23/473* (2013.01); *H01L 24/34* (2013.01); *H01L 2224/32245* (2013.01)
USPC .............................. 257/692; 257/98; 257/698

(58) Field of Classification Search
USPC .............................. 257/98, 692, 698, E33.066
See application file for complete search history.

(56) References Cited

U.S. PATENT DOCUMENTS

| 2002/0014694 | A1* | 2/2002 | Olofsson | 257/732 |
| 2012/0275186 | A1* | 11/2012 | Min | 362/607 |
| 2013/0049045 | A1* | 2/2013 | Lee et al. | 257/98 |

FOREIGN PATENT DOCUMENTS

JP    2011-243916 A    12/2011

* cited by examiner

*Primary Examiner* — Phuc Dang
(74) *Attorney, Agent, or Firm* — Sughrue Mion, PLLC

(57) ABSTRACT

A semiconductor unit includes a base having a surface where a first insulation layer is disposed, a second insulation layer spaced apart from the first insulation layer to form a region therebetween and disposed parallel to the surface of the base where the first insulation layer is disposed, a single conductive layer disposed across the first insulation layer and the second insulation layer, and a semiconductor device bonded to the conductive layer.

7 Claims, 2 Drawing Sheets

SEMICONDUCTOR UNIT

BACKGROUND OF THE INVENTION

The present invention relates to a semiconductor unit having a semiconductor device bonded to a conductive layer.

Japanese Unexamined Patent Application Publication No. 2011-243916 discloses a semiconductor unit in which an insulation layer has on its top surface spaced-apart first and second conducive layers. A semiconductor device is bonded to the first conductive layer, and an electrode terminal is bonded to the second conductive layer. The first and second conductive layers are connected by a wire.

There has been a demand for reducing thermal stress that acts on an insulation layer in a semiconductor unit of the above configuration.

The present invention is directed to providing a semiconductor unit of a structure that allows reduction of thermal stress on the insulation layer.

SUMMARY OF THE INVENTION

In accordance with an aspect of the present invention, a semiconductor unit includes a base having a surface where a first insulation layer is disposed, a second insulation layer spaced apart from the first insulation layer to form a region therebetween and disposed parallel to the surface of the base where the first insulation layer is disposed, a single conductive layer disposed across the first insulation layer and the second insulation layer, and a semiconductor device bonded to the conductive layer.

Other aspects and advantages of the invention will become apparent from the following description, taken in conjunction with the accompanying drawings, illustrating by way of example the principles of the invention.

DETAILED DESCRIPTION OF THE EMBODIMENTS

Figure 1:
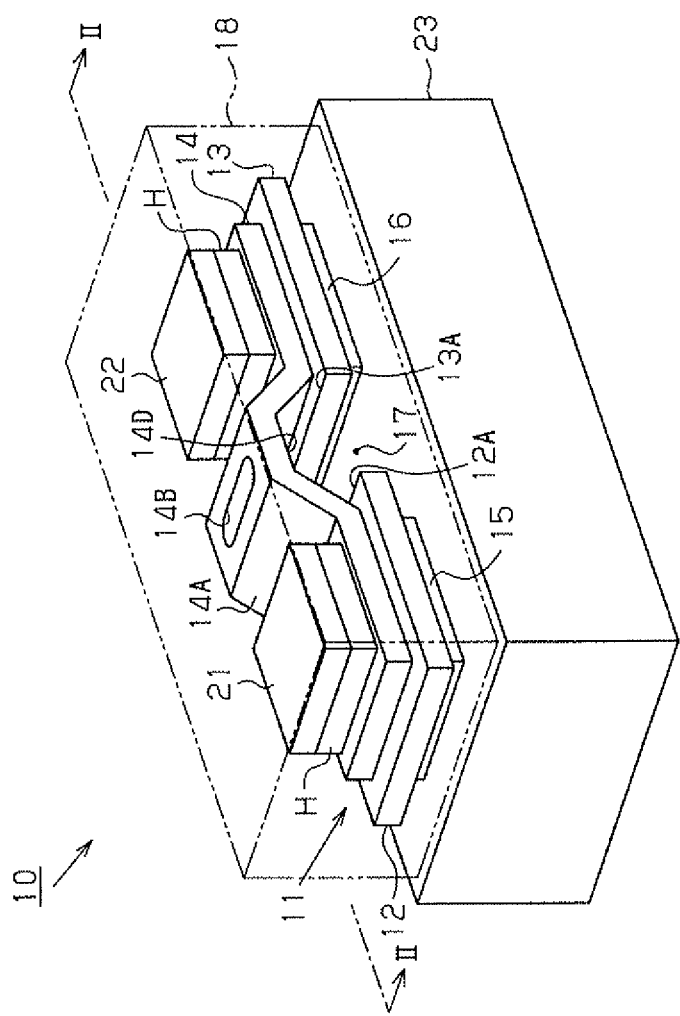
FIG. 1 is a schematic perspective view of a semiconductor unit according to an embodiment of the present invention.

The following will describe one embodiment of the semiconductor unit according to the present invention with reference to the accompanying drawings. Referring to FIG. 1, the semiconductor unit of the present embodiment which is designated generally by 10 includes a circuit board 11 and two semiconductor devices 21, 22 mounted on the circuit board 11. It is noted that the upper and lower sides of the semiconductor unit 10 as viewed in FIG. 1 correspond to its upper and lower sides, respectively. The circuit board 11 includes a first ceramic substrate 12 or first insulation layer, a second ceramic substrate 13 or second insulation layer, and a single metal plate 14 or conductive layer bonded to the top surfaces of the respective first and second ceramic substrates 12, 13.

Figure 2:
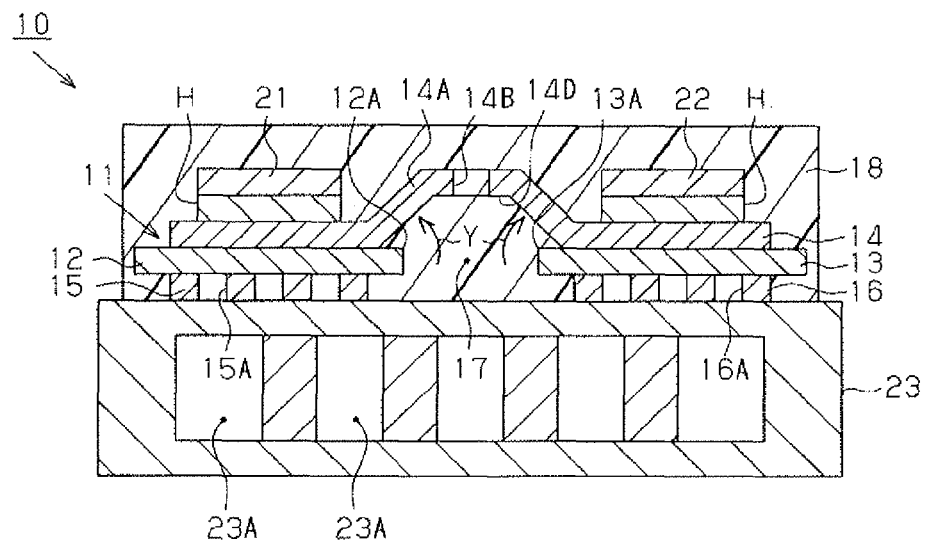
FIG. 2 is a sectional view taken along the line II-II of FIG. 1.

Referring to FIG. 2, first and second stress relief members 15, 16 are provided below the first and second ceramic substrates 12, 13, respectively. The stress relief members 15, 16 are brazed at their top surfaces to the first and second ceramic substrates 12, 13 and at their bottom surfaces to a heat sink 23 that has a rectangular profile in plan view. The first and second ceramic substrates 12, 13 are provided above the top surface of the heat sink 23 with the first and second stress relief members 15, 16 interposed therebetween. In the present embodiment, the heat sink 23 corresponds to the heat radiation member of the present invention, and also to the base of the present invention where the first and second ceramic substrates 12, 13 are disposed. The first and second ceramic substrates 12, 13 are located in the same plane that is parallel to the top surface of the heat sink 23. The second ceramic substrate 13 is disposed parallel to the surface where the first ceramic substrate 12 is provided. The first and second ceramic substrates 12, 13 are spaced apart from each other in longitudinal direction of the heat sink 23 thereby to form a region 17 therebetween.

The first and second ceramic substrates 12, 13 are made of, for example, aluminum nitride, alumina or silicon nitride. The first and second stress relief members 15, 16 are provided, for example, by a metal plate made of aluminum with a purity of 99.99 wt % or more (or 4N—Al). The first and second stress relief members 15, 16 have plural holes 15A, 16A formed therethrough in the direction of their thickness, respectively.

The heat sink 23 has therein plural straight channels 23A through which coolant flows. Although not shown in the drawing, the heat sink 23 has an inlet and an outlet through which coolant flows into and out of the channels 23A.

The metal plate 14 on the top surfaces of the first and second ceramic substrates 12, 13 has a rectangular profile in plan view and is made of a conductive material such as aluminum or copper. The metal plate 14 is brazed at its bottom surface to the first and second ceramic substrates 12, 13. The metal plate 14 is disposed across the first and second ceramic substrates 12, 13. That is, the single metal plate 14 is shared by the first and second ceramic substrates 12, 13 and connects between the first and second ceramic substrates 12, 13.

The metal plate 14 has at its longitudinally middle portion a bent portion 14A in the direction of the thickness of the metal plate 14. The bent portion 14A is formed over the entire transverse length of the metal plate 14. The bent portion 14A is positioned facing the region 17 that is defined between the first and second ceramic substrates 12, 13 when the metal plate 14 is brazed in place to the first and second ceramic substrates 12, 13. The bent portion 14A is directed upward away from the region 17 thereby to form a recess 14D in the metal plate 14.

The bent portion 14A is formed in such a manner that no part of the bent portion 14A is in contact with the first corner 12A of the first ceramic substrate 12 between its top surface and its end surface facing the second ceramic substrate 13, and also that no part of the bent portion 14A is in contact with the second corner 13A of the second ceramic substrate 13 between its top surface and its end surface facing the first ceramic substrate 12. Specifically, the bent portion 14A extends from the first ceramic substrate 12 at a position away from the first corner 12A and also from the second ceramic substrate 13 at a position away from the second corner 13A, so that the bent portion 14A extends clear of the first and second corners 12A, 13A.

The metal plate 14 has a hole 14B formed through the bent portion 14A in the direction of the thickness of the metal plate 14. The semiconductor devices 21, 22, which are for example power semiconductor devices such as an insulated gate bipolar transistor or field effect transistor, are bonded by solder H to the top surface of the metal plate 14. The semiconductor devices 21, 22 are bonded to the top surface of the metal plate 14 at positions over the first and second ceramic substrates 12, 13, respectively.

In the semiconductor unit 10, part of the heat sink 23 and the components mounted thereon are molded by a mold resin 18. Specifically the mold resin 18 covers the top surface of the heat sink 23 and also covers the semiconductor devices 21, 22, the metal plate 14, the first and second ceramic substrates 12, 13 and the first and second stress relief members 15, 16. The mold resin 18 fills the region 17 between the first and second ceramic substrates 12, 13 and also the hole 14B in the bent portion 14A of the metal plate 14.

The following will describe the operation of the semiconductor unit 10 of the present embodiment.

The semiconductor unit 10 can be used as an inverter which is installed in a vehicle and converts DC power of a battery into AC power to drive a travel motor of the vehicle.

The heat generated by the semiconductor devices 21, 22 in operation is transferred through the metal plate 14, the first and second ceramic substrates 12, 13 and the first and second stress relief members 15, 16 to the heat sink 23. In this case, the metal plate 14 is heated not only by the heat of the semiconductor devices 21, 22, but also by the joule heat caused by the current flowing through the metal plate 14, and then thermally expanded.

Although such thermal expansion of the metal plate 14 causes deformation of the first and second ceramic substrates 12, 13, the separate provision of the first and second ceramic substrates 12, 13 for the single metal plate 14 in the present embodiment serves to restrict the deformation of the first and second ceramic substrates 12, 13.

Any the deformation of the first and second ceramic substrates 12, 13 may cause the first and second ceramic substrates 12, 13 to deflect in such a manner that the first and second corners 12A, 13A of the first and second ceramic substrates 12, 13 are moved toward the metal plate 14 in the direction as indicated by arrows Y in FIG. 2. However, no part of the metal plate 14 is brought into contact with the first and second corners 12A, 13A because of the bent portion 14A. The bent portion 14A serves as a relief that prevents contact between the metal plate 14 and the first and second corners 12A, 13A of the first and second ceramic substrates 12, 13.

The semiconductor unit 10 of the present embodiment offers the following advantages.

(1) The metal plate 14 is disposed across the spaced-apart first and second ceramic substrates 12, 13. The separate first and second ceramic substrates 12, 13 provided for the single metal plate 14 or the conductive layer may be formed relatively smaller in size as compared to the case that a single ceramic substrate is provided for the metal plate 14. Although the thermal expansion of the metal plate 14 due to the heat of the semiconductor devices 21, 22 in operation causes deformation to the first and second ceramic substrates 12, 13, the provision of the first and second ceramic substrates 12, 13 of a smaller size results in less deformation of the first and second ceramic substrates 12, 13 due to the expansion of the metal plate 14, thereby resulting in less thermal stress on the first and second ceramic substrates 12, 13.

(2) The metal plate 14 has the bent portion 14A at the position facing the region 17 between the first and second ceramic substrates 12, 13. The metal plate 14 also has the recess 14D formed by the bent portion 14A. With the deformation of the first and second ceramic substrates 12, 13, the bent portion 14A is deformed in such a manner that the recess 14D is narrowed, resulting in less stress on the metal plate 14 and on the first and second ceramic substrates 12, 13.

(3) The hole 14B formed in the bent portion 14A of the metal plate 14 helps to further reduce the stress on the metal plate 14.

(4) The bent portion 14A is formed in such a manner that no part of the metal plate 14 is brought into contact with the first and second corners 12A, 13A of the first and second ceramic substrates 12, 13 when deflection of the first and second ceramic substrates 12, 13 occurs and the first and second corners 12A, 13A of the first and second ceramic substrates 12, 13 are moved toward the metal plate 14. Such configuration of the bent portion 14A allows the resin such as 18 to be filled between the first corner 12A and the metal plate 14 and between the second corner 13A and the metal plate 14. In this case, the resin also serves to restrict the displacement of the first and second corners 12A, 13A.

(5) The heat sink 23 is bonded to the first and second stress relief members 15, 16. The heat of the semiconductor devices 21, 22 is transferred through the first and second stress relief members 15, 16 to the heat sink 23, so that the semiconductor devices 21, 22 are cooled by the heat sink 23 and the expansion of the metal plate 14 due to the heat of the semiconductor devices 21, 22 is restricted. Thus, the deformation of the first and second ceramic substrates 12, 13 becomes less, resulting in further reduction of the thermal stress on the first and second ceramic substrates 12, 13.

(6) The first and second stress relief members 15, 16 interposed between the heat sink 23 and the first and second ceramic substrates 12, 13 help to further reduce the thermal stress on the first and second ceramic substrates 12, 13 due to the heat of the semiconductor devices 21, 22.

(7) The mold resin 18 covering the semiconductor devices 21, 22 and the circuit board 11 serves to restrict the thermal expansion of the metal plate 14 of the circuit board 11 due to the heat of the semiconductor devices 21, 22, resulting in less deformation of the first and second ceramic substrates 12, 13 bonded to the metal plate 14 and hence less thermal stress on the first and second ceramic substrates 12, 13.

(8) The metal plate 14 or single conductive layer is bonded to the first and second ceramic substrates 12, 13. Such configuration requires no wire for connecting between the first and second ceramic substrates 12, 13, resulting in reduced number of conductive layers and also of components of the semiconductor unit as compared to the case that separate conductive layers on respective insulation layers are connected by a wire as disclosed in the above-cited publication No. 2011-243916.

(9) The metal plate 14 has the hole 14B formed through the bent portion 14A that faces the region 17 between the first and second ceramic substrates 12, 13. Such hole 14B through which the mold resin 18 can flow helps to fill the region 17 with the mold resin 18.

(10) Reducing the stress on the first and second ceramic substrates 12, 13 helps to prevent cracks from occurring in the first and second ceramic substrates 12, 13.

(11) Reducing the stress on the metal plate 14 and the first and second ceramic substrates 12, 13 helps to prevent cracks from occurring in the bonding layers therebetween, for example, the layer between the metal plate 14 and the first ceramic substrate 12.

The above embodiment may be modified in various ways as exemplified below.

Figure 3:
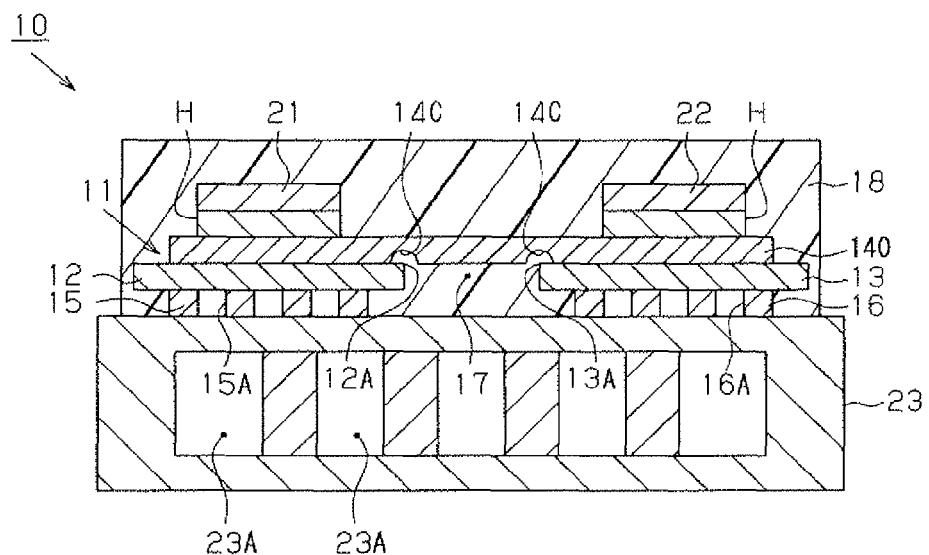
FIG. 3 is a sectional view of another embodiment of the semiconductor unit according to the present invention.

The metal plate 14 may dispense with the bent portion 14A (shown in FIG. 2) as long as the thermal stress on the metal plate 14 is reduced enough. As shown in FIG. 3, the metal plate designated by 140 may be formed in a planar shape having no bent portion such as 14A. The metal plate 140 has in its bottom surface two recesses 14C at positions over the first and second corners 12A, 13A of the first and second ceramic substrates 12, 13. The recesses 14C serve as a relief that prevents contact between the metal plate 140 and the first and second corners 12A, 13A of the first and second ceramic substrates 12, 13. The recesses 14C also serve to reduce the thermal stress on the metal plate 140.

The hole 14B formed through the bent portion 14A may be replaced by such a cutout that allows deformation of the metal plate 14 and hence reduces the thermal stress on the metal plate 14.

The metal plate 14 may dispense with the hole 14B as long as the stress on the metal plate 14 is reduced enough.

The semiconductor unit 10 may dispense with the first and second stress relief members 15, 16 as long as the thermal stress on the first and second ceramic substrates 12, 13 is reduced enough.

The heat sink 23 bonded to the first and second stress relief members 15, 16 may be replaced by any suitable planar heat radiation member.

The heat sink 23 and the components mounted thereon do not necessarily need to be molded by a mold resin such as 18 as long as the thermal stress on the first and second ceramic substrates 12, 13 is reduced enough.

The number of semiconductor devices such as 21, 22 may be increased or decreased as required.

The number of insulation layers such as 12, 13 may be increased as required.

The separate first and second stress relief members 15, 16 may be replaced by a single stress relief member.

The first and second ceramic substrates 12, 13 do not necessarily need to be located in the same plane. The second ceramic substrate 13 only needs to be disposed parallel to the surface of the heat sink 23 or the base where the first ceramic substrate 12 is disposed. For example, the first and second ceramic substrates 12, 13 may be disposed on separate bases.

What is claimed is:

1. A semiconductor unit, comprising:
    a base having a surface where a first insulation layer is disposed;
    a second insulation layer spaced apart from the first insulation layer to form a region therebetween, the second insulation layer being disposed parallel to the surface of the base where the first insulation layer is disposed;
    a single conductive layer disposed across the first insulation layer and the second insulation layer;
    wherein the first insulation layer isolates between the single conductive layer and the base; and the second insulation layer isolates between the single conductive layer and the base; and
    a semiconductor device bonded to the conductive layer.

2. The semiconductor unit of claim 1, wherein the conductive layer has a bent portion that faces the region formed between the first and second insulation layers.

3. The semiconductor unit of claim 2, wherein the bent portion has a hole or cutout formed therethrough.

4. The semiconductor unit of claim 1, wherein the base is a heat radiation member.

5. The semiconductor unit of claim 1, further comprising a stress relief member provided between the first insulation layer and the base and between the second insulation layer and the base.

6. The semiconductor unit of claim 1, wherein the semiconductor device, the conductive layer, the first insulation layer, the second insulation layer and the base are molded by a mold resin.

7. The semiconductor unit of claim 1, wherein the first insulation layer has a first corner between its surface to which the conductive layer is bonded and its end surface facing the second insulation layer, and the second insulation layer has a second corner between its surface to which the conductive layer is bonded and its end surface facing the first insulation layer,
    wherein the conductive layer has a relief that prevents contact between the conductive layer and the first corner of the first insulation layer and between the conductive layer and the second corner of the second insulation layer.

* * * * *